(12) United States Patent
Jeong

(10) Patent No.: US 10,096,775 B2
(45) Date of Patent: Oct. 9, 2018

(54) SUBSTRATE FOR USE IN MANUFACTURING DISPLAY DEVICE AND METHOD FOR FORMING ELEMENT ON SUBSTRATE

(71) Applicant: Samsung Display Co., Ltd., Yongin-si, Gyeonggi-do (KR)

(72) Inventor: Cheol-Gyu Jeong, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/462,394

(22) Filed: Mar. 17, 2017

(65) Prior Publication Data

US 2017/0194565 A1    Jul. 6, 2017

Related U.S. Application Data

(62) Division of application No. 14/027,042, filed on Sep. 13, 2013, now Pat. No. 9,627,618.

(30) Foreign Application Priority Data

May 30, 2013    (KR) ........................ 10-2013-0062048

(51) Int. Cl.
*H01L 51/00*    (2006.01)
*H01L 27/32*    (2006.01)
(Continued)

(52) U.S. Cl.
CPC ........ *H01L 51/0012* (2013.01); *H01L 23/544* (2013.01); *H01L 27/3246* (2013.01);
(Continued)

(58) Field of Classification Search
None
See application file for complete search history.

(56) References Cited

U.S. PATENT DOCUMENTS 7,498,745 B2    3/2009    Choi et al.
2010/0026173 A1*    2/2010    Lhee .................. H01L 27/3211
                                                            313/504
(Continued)

FOREIGN PATENT DOCUMENTS

KR    1020060102094    9/2006
KR    1020070097218    10/2007

*Primary Examiner* — Ashok Patel
(74) *Attorney, Agent, or Firm* — Innovation Counsel LLP

(57) ABSTRACT

A substrate is for use in manufacturing a display device. The substrate includes a first area that corresponds to pixel positions. The substrate further includes a second area adjacent to the first area. The substrate further includes a first mark disposed in the second area, wherein a first virtual line corresponds to the first mark. The substrate further includes a second mark disposed in the second area and spaced from the first mark, wherein a second virtual line corresponds to the second mark and intersects the first virtual line at a virtual reference point. The substrate further includes an indicator disposed in the second area, spaced from the first mark and the second mark, and corresponding to an opening of a mask, wherein a positional relation between the virtual reference point and a point of the indicator represents a positional relation between the substrate and the mask.

10 Claims, 11 Drawing Sheets

(51) Int. Cl.
  *H01L 51/56* (2006.01)
  *H01L 23/544* (2006.01)
(52) U.S. Cl.
  CPC .......... *H01L 51/0002* (2013.01); *H01L 51/56* (2013.01); *H01L 27/3211* (2013.01); *H01L 2223/5442* (2013.01); *H01L 2223/54426* (2013.01); *H01L 2223/54486* (2013.01); *H01L 2924/0002* (2013.01)

(56) References Cited

U.S. PATENT DOCUMENTS

| | | | |
|---|---|---|---|
| 2010/0245271 A1 | 9/2010 | Park | |
| 2011/0234550 A1* | 9/2011 | Hong | H01L 27/326 345/204 |
| 2012/0154722 A1 | 6/2012 | Kang et al. | |
| 2014/0131667 A1* | 5/2014 | Chang | H01L 51/56 257/40 |
| 2014/0239049 A1 | 8/2014 | Kang et al. | |
| 2016/0343944 A1* | 11/2016 | Lee | H01L 27/3223 |

* cited by examiner

SUBSTRATE FOR USE IN MANUFACTURING DISPLAY DEVICE AND METHOD FOR FORMING ELEMENT ON SUBSTRATE

RELATED APPLICATIONS

This application is a divisional application of U.S. patent application Ser. No. 14/027,042 filed on Sep. 13, 2013, which claims priority to and the benefit of Korean Patent Application No. 10-2013-0062048 filed in the Korean Intellectual Property Office on May 30, 2013, the entire contents of which are incorporated herein by reference.

BACKGROUND

1. Field

The present invention relates to a substrate for a display device and a method for depositing a thin film.

2. Description of the Related Art

An organic light emitting display typically includes a substrate and a plurality of pixels formed on the substrate. Each of the pixels includes a pixel circuit and an organic light emitting diode of which emission may be controlled by the pixel circuit. The organic light emitting diode may have a stacked structure that may include a pixel electrode, an organic emission layer, and (a portion of) a common electrode. The organic light emitting display may use lights emitted from a plurality of organic light emitting diodes to display an image.

The organic emission layer may be formed using a pattern mask that has a plurality of openings corresponding to a design of the organic emission layer. The pattern mask may be fixed to a frame with a tensile force being applied to the pattern mask. The combination of the mask and the frame may be arranged on the substrate inside a chamber. A deposition source may also be disposed inside the chamber. An organic material evaporated from the deposition source may pass through the opening of the pattern mask and may be deposited on the substrate so as to form the organic emission layer.

During the deposition process, if an error occurs in the alignment between the substrate and the pattern mask, the error may cause a process failure. Therefore, accuracy in the alignment between the substrate and the pattern mask is very important in manufacturing the organic light emitting display.

The above information disclosed in this Background section is for enhancement of understanding of the background of the described technology. The Background section may contain information that does not form the prior art that is already known in this country to a person of ordinary skill in the art.

SUMMARY

An embodiment of the present invention may be related to a substrate for use in manufacturing a display device. The substrate may facilitate substantially accurate alignment between a mask and the substrate and/or substantially accurate alignment between the mask and other substrates. Advantageously, material may be deposited through the mask at substantially accurate positions on a substrate used in the display device, and satisfactory quality of the display device may be provided.

The substrate may include a first area that corresponds to a plurality of pixel positions. The substrate may further include a second area adjacent to the first area. The substrate may further include a first mark disposed in the second area, wherein a first virtual line corresponds to the first mark. The substrate may further include a second mark disposed in the second area and spaced from the first mark, wherein a second virtual line corresponds to the second mark and intersects the first virtual line at a first virtual reference point. The substrate may further include a first indicator disposed in the second area, spaced from each of the first mark and the second mark, and corresponding to a first opening of a mask, wherein a positional relation between the first virtual reference point and a point of the first indicator represents a positional relation between the substrate and the mask.

The substrate may include a first-colored layer having a first color, formed of an organic material, and disposed in a first pixel position of the plurality of pixel positions, wherein the first indicator is formed of the organic material.

The substrate may include a first-colored layer having a first color and disposed in a first pixel position of the plurality of pixel positions, wherein the first virtual line overlaps the first-colored layer and overlaps the first indicator.

The substrate may include a third mark disposed in the second area and spaced from each of the first mark, the second mark, and the first indicator, wherein a third virtual line corresponds to the third mark and intersects the second virtual line at a second virtual reference point that is spaced from the first virtual reference point. The substrate may further include a second indicator disposed in the second area, spaced from each of the first mark, the second mark, the third mark, and the first indicator, and corresponding to a second opening of the mask. The substrate may further include a second-colored layer having a second color different from the first color and disposed in a second pixel position of the plurality of pixel positions, wherein the third virtual line overlaps the second-colored layer and overlaps the second indicator.

Each of the first virtual line and the third virtual line may extend in a first direction. The first mark may be aligned with the third mark in a second direction that is different from the first direction.

A first side of the second mark may be longer than a second side of the second mark and extends in the second direction.

A center point of the first indicator may coincide with the first virtual reference point.

The substrate may include a third mark disposed in the second area and spaced from each of the first mark, the second mark, and the first indicator. The substrate may further include a fourth mark disposed in the second area and spaced from each of the first mark, the second mark, the third mark, and the first indicator. The first virtual line may further correspond to the fourth mark. The second virtual line may further correspond to the third mark. The first indicator may be disposed between the first mark and the fourth mark. The first indicator may be disposed between the second mark and the third mark.

The first mark may be aligned with the second mark in a first direction. The first mark may be aligned with the third mark in a second direction different from the first direction. The third mark may be aligned with the fourth mark in the second direction.

A distance between a center the first mark and a center of the third mark may be equal to a multiple of a double of a distance between a center of a first pixel position of the plurality of pixel positions and a center of a second pixel position of the plurality of pixel positions, wherein the second pixel position immediately neighbors the first pixel position.

An embodiment of the invention may be related to a method for forming at least one element on at least one substrate. The method may include the following steps: disposing a first substrate and a mask in a chamber, wherein the first substrate includes a first area corresponding to a plurality of pixel positions, a second area adjacent to the first area, a first mark disposed in the second area, and a second mark disposed in the second area and spaced from the first mark, wherein a first virtual line corresponds to the first mark, wherein a second virtual line corresponds to the second mark and intersects the first virtual line at a first virtual reference point, and wherein the mask has a first opening and a second opening; using the mask to form a first indicator in the second area, wherein the first indicator is spaced from each of the first mark and the second mark and corresponds to the first opening; and using positional relation between the first virtual reference point and a point of the first indicator to assess a positional relation between the first substrate and the mask.

The method may include the following steps: determining that a distance between the first virtual reference point and the point of the first indicator has a first value; determining that the first value is unacceptable; adjusting at least one of a position of the mask and a position of the first substrate such that the distance between the first virtual reference point and the point of the first indicator has a second value that is acceptable; and after the adjusting, using the mask to form a deposited element in a first pixel position of the plurality of pixel positions, wherein the deposited element corresponds to the second opening.

The method may include the following steps: determining that a distance between the first virtual reference point and the point of the first indicator has a first value; determining that the first value is unacceptable; adjusting at least one of a position of the mask and a position of the first substrate such that the first substrate is at an acceptable position and such that the distance between the first virtual reference point and the point of the first indicator has a second value that is acceptable; after the adjusting, disposing a second substrate at the acceptable position; and using the mask to form a first deposited element on the second substrate, wherein the first element layer corresponds to the second opening.

The method may include the following steps: when forming the first indicator, using the mask to form a second deposited element in a first pixel position of the plurality of pixel positions, wherein the second deposited element corresponds to the second opening; and after the adjusting and before disposing the second substrate in the chamber, removing the first substrate from the chamber.

The method may include the following steps: determining that a distance between the first virtual reference point and the point of the first indicator is acceptable; and after the determining, using the mask to form a deposited element in a first pixel position of the plurality of pixel positions, wherein the deposited element corresponds to the second opening.

The method may include the following steps: when forming the first indicator, using the mask to form a deposited element in a first pixel position of the plurality of pixel positions, wherein the deposited element corresponds to the second opening; and determining whether a distance between the first virtual reference point and the point of the first indicator is acceptable.

A first side of the first mark may be longer than a second side of the first mark and extends in a first direction. A first side of the second mark may be longer than a second side of the second mark and extends in a second direction different from the first direction.

The first substrate may further include a third mark and a fourth mark. The third mark may be disposed in the second area and may be spaced from each of the first mark and the second mark. The fourth mark may be disposed in the second area and may be spaced from each of the first mark, the second mark, and the third mark. The first virtual line may further correspond to the fourth mark. The second virtual line may further correspond to the third mark. The first indicator may be formed between the first mark and the fourth mark. The first indicator may be formed between the second mark and the third mark.

The first mark may be aligned with the second mark in a first direction. The first mark may be aligned with the third mark in a second direction different from the first direction. The third mark may be aligned with the fourth mark in the second direction.

A distance between a center the first mark and a center of the third mark may be equal to a multiple of a double of a distance between a center of a first pixel position of the plurality of pixel positions and a center of a second pixel position of the plurality of pixel positions, the second pixel position immediately neighboring the first pixel position.

An embodiment of the invention may be related to a substrate for use in manufacturing a display device. The substrate may include the following elements: a first area having a plurality of pixels (or pixel positions) formed therein; and a second area having an alignment mark and a thin film for a test (or indicator for calibrating alignment) formed therein. The alignment mark may include at least two marks of which a reference point is set by a virtual intersecting point, and the thin film for the test may be spaced apart from the alignment mark.

Distances between a center point of the thin film for the test and the reference point may correspond to an alignment error between the substrate and a pattern mask.

Each of the plurality of pixels may include a thin film transistor, a capacitor, and a pixel electrode. At least one of the plurality of pixels may further include an organic emission layer. The plurality of pixels may be arranged in a first direction and a second direction crossing the first direction.

The alignment mark may include a first mark having two long sides parallel to the first direction; and a second mark spaced apart from the first mark in the first direction and having two long sides parallel to the second direction. The reference point may be set as a point where a center line of the first mark and a center line of the second mark intersect.

The plurality of pixels may include a pixel column arranged in the first direction, and the center line of the first mark may match a center line of the pixel column. The plurality of pixels may have a plurality of colors, and the first mark and the thin film for the test may be formed at least one by one for each color of the pixels.

The alignment mark may include a third mark and a fourth mark in a dot shape located on one line in the first direction; and a fifth mark and a sixth mark in a dot shape spaced apart from the third mark and the fourth mark with equal distances in the second direction. The reference point may be set as a point where a connection line between the third mark and the sixth mark and a connection line between the fourth mark and the fifth mark intersect.

The plurality of pixels may include a pixel column arranged in the first direction, and the third mark and the fourth mark may be located on the center line of the pixel column. The center of the fifth mark and the center of the sixth mark may be spaced apart from the center of the third mark and the center of the fourth mark with a distance corresponding to a double of a pixel pitch in the second direction. The plurality of pixels may have a plurality of colors, and the alignment mark and the thin film for the test may be formed at least one by one for each color of the pixels.

An embodiment of the invention may be related to a method for depositing at least one element on at least one substrate. The method may include the following steps: preparing a substrate having a plurality of pixels and an alignment mark of which a reference point is set by a virtual intersecting point formed therein, and a pattern mask having a plurality of openings formed therein, and putting the substrate and the pattern mask into a deposition chamber and aligning the substrate and the pattern mask; forming a thin film for a test on the substrate with a distance from the alignment mark; and photographing the alignment mark and the thin film for the test in measurement equipment, and measuring an alignment error between the substrate and the pattern mask by measuring distances between the reference point by the alignment mark and a center point of the thin film for the test.

An organic emission layer may be formed on the plurality of pixels simultaneously when the thin film for the test is formed, and a succeeding substrate may be put into the deposition chamber and remains in a standby state after the thin film for the test and the organic emission layer are formed.

A substrate determined as a faulty substrate among the substrates in the measurement equipment may be discarded, the alignment error may be corrected by moving one of the succeeding substrate and the pattern mask, and the organic emission layer may be formed on a plurality of pixels formed on the succeeding substrate. A substrate determined as a substrate of fair quality among the substrates in the measurement equipment may be transported to a succeeding process, and the organic emission layer may be formed on a plurality of pixels formed on the succeeding substrate.

The substrate having completed an error measurement in the measurement equipment may be put into the deposition chamber again, and the organic emission layer may be formed on the plurality of pixels. When the alignment error is measured in the measurement equipment, the alignment error may be corrected by moving one of the substrate and the pattern mask before the organic emission layer is formed.

The plurality of pixels may be arranged in a first direction and a second direction crossing the first direction and have a plurality of colors.

The alignment mark may include a first mark having two long sides parallel to the first direction and a second mark having two long sides parallel to the second direction. The reference point may be set as a point where a center line of the first mark and a center line of the second mark intersect.

The alignment mark may include a third mark and a fourth mark located on one line in the first direction, and a fifth mark and a sixth mark spaced apart from the fifth mark and the sixth mark with equal distances from the third mark and the fourth mark in the second direction. The reference point may be set as a point where a connection line between the third mark and the sixth mark and a connection line between the fourth mark and the fifth mark intersect.

The alignment mark and the thin film for the test may be formed at least one by one for each color of the pixels, and the alignment error between the substrate and the pattern mask may be measured at least one by one for each color of the pixels.

According to embodiments of the invention, a thin film for a test (or indicator for calibrating alignment) does not overlap an alignment mark, so that a measurement range of a measurement equipment may not be limited by the alignment mark. Accordingly, the measurable range may be maximized, and substantially accurate measurement may be performed. According to embodiments of the invention, interference between an image of an alignment mark and an image of an alignment indicator may be prevented given that the indicator is spaced from the mark. Advantageously, alignment calibration may be substantially accurately performed.

DETAILED DESCRIPTION

The present invention is described more fully hereinafter with reference to the accompanying drawings, in which embodiments of the invention are shown. As those skilled in the art would realize, the described embodiments may be modified in various different ways, all without departing from the spirit or scope of the present invention.

In the description and claims, if a part "includes" a component, the part may further include zero or more additional components. In the description and claims, when it is described that a first element (such as one of a layer, a film, an area, a plate, etc.) is "on" or "above" a second element, it may mean that the first element directly contacts the second element, or it may mean that a third element exists between the first element and the second element.

Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

In the description, the term "connect" may mean "electrically connect"; the term "insulate" may mean "electrically insulate".

Figure 1:
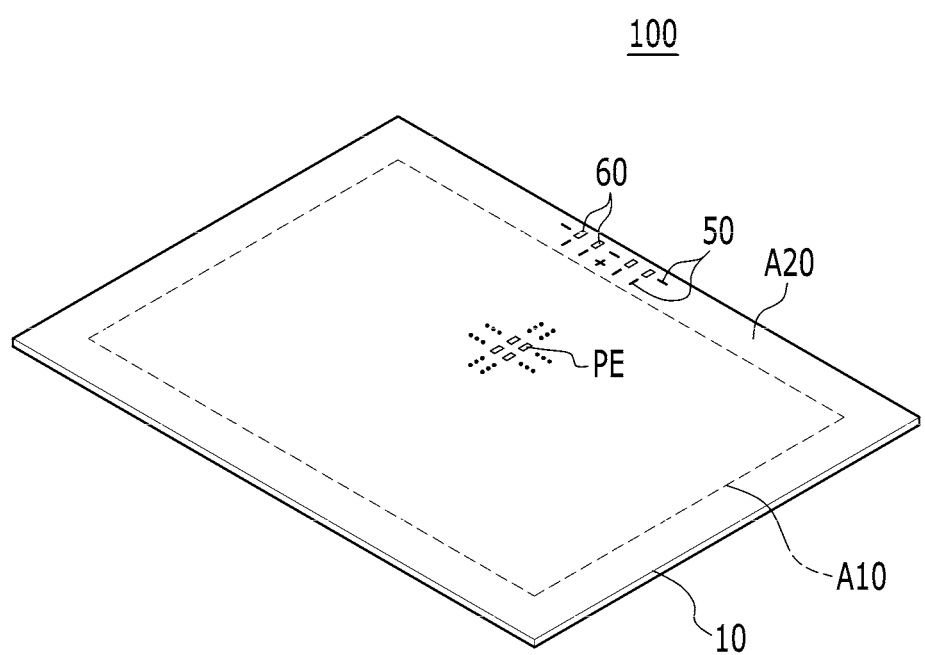
FIG. 1 is a perspective view illustrating a substrate for use in a display device according to an embodiment of the present invention.

FIG. 1 is a perspective view illustrating a substrate 100 for use in a display device according to an embodiment of the present invention.

Referring to FIG. 1, the substrate 100 includes a first area A10 and a second area A20 adjacent to (and surrounding) the first area A10. A plurality of pixels PE (each including a pixel electrode) is located in the first area A10 on a base substrate 10 of the substrate 100. An alignment mark 50 and a thin film 60 (or indicator 60) for use in a test (or alignment calibration) are located in the second area A20.

The thin film 60 may be formed before or when an organic emission layer is formed in the first area A10. The thin film 60 may be used for identifying an error in the alignment between the substrate 100 and a pattern mask based on a location relation with the alignment mark 50.

A pixel PE may include a pixel circuit (which may include a thin film transistor and a capacitor), a pixel electrode and an organic emission layer. The pixel PE may further include a portion of a common electrode.

Figure 2A:
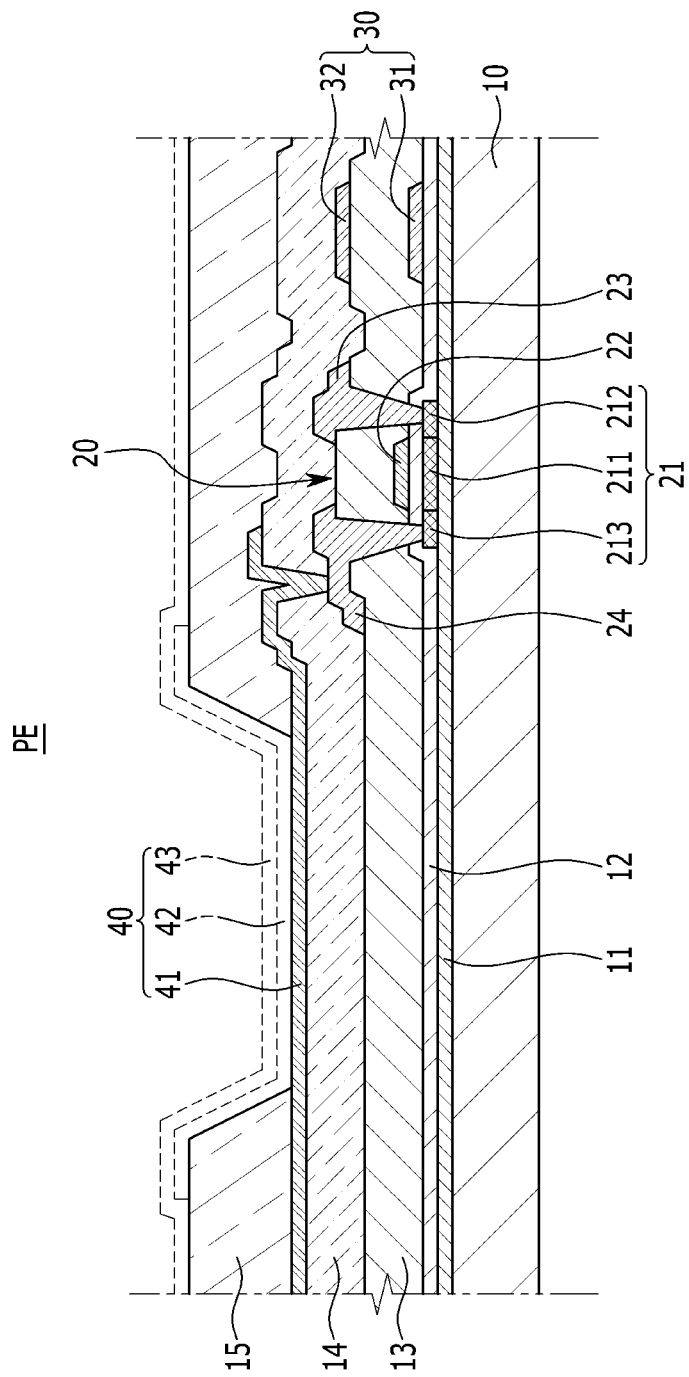
FIG. 2A and FIG. 2B are cross-sectional views illustrating a pixel of the substrate illustrated in FIG. 1 according to an embodiment of the present invention.
Figure 2B:
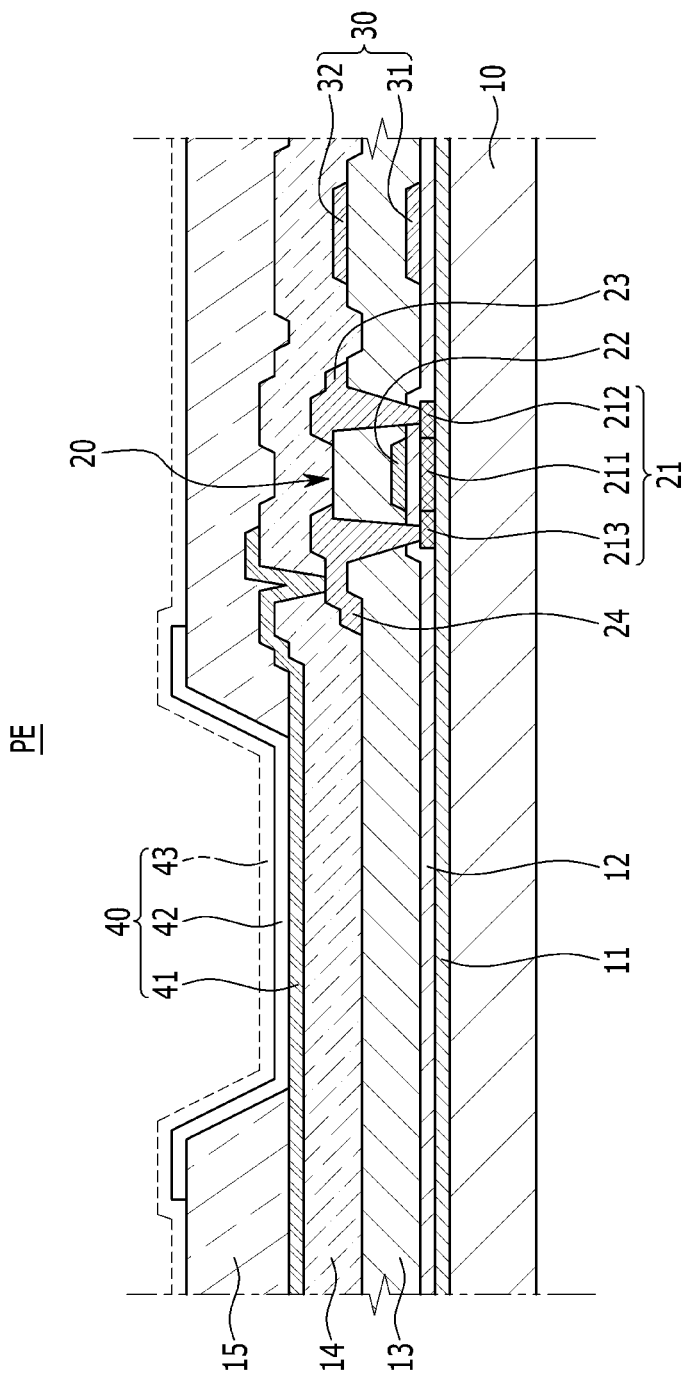

FIG. 2A and FIG. 2B are cross-sectional views illustrating a pixel PE of the substrate 100 illustrated in FIG. 1 according to an embodiment of the present invention. FIG. 2A illustrates a state before forming an organic emission layer 42, and FIG. 2B illustrates a state after forming an organic emission layer 42.

Referring to FIGS. 1, 2A, and 2B, a buffer layer 11, a thin film transistor 20, a capacitor 30, and a pixel electrode 41 are located on the base substrate 10. The base substrate 10 may be a rigid substrate (such as a glass substrate) or a flexible substrate (such as a polymer film). A polymer film may have a higher water vapor transmittance rate and oxygen transmittance rate in comparison with a glass substrate. In an embodiment, the base substrate 10 is formed of a polymer film, and a barrier layer for minimizing water and oxygen permeation may be located between the base substrate 10 and the buffer layer 11.

The buffer layer 11 is formed of an inorganic film and includes, for example, $SiO_2$ or SiNx. The buffer layer 11 provides a flat surface for forming the pixel circuit and suppresses permeation of water and/or other foreign substances into the pixel circuit (which includes the thin film transistor 20 and the capacitor 30) and the organic light emitting diode 40.

The thin film transistor 20 and the capacitor 30 are formed on the buffer layer 11. The thin film transistor 20 includes a semiconductor layer 21, a gate electrode 22, a source electrode 23, and a drain electrode 24. The semiconductor layer 21 is formed of a polysilicon or oxide semiconductor. The semiconductor layer 21 includes a (non-doped) channel area 211, an impurity doped source area 212 disposed at a first side of the channel area 211, and an impurity doped drain 213 disposed at a second side of the channel area 211. In an embodiment, the semiconductor layer 21 is formed of an oxide semiconductor, and the pixel PE may include an additional passivation layer for protecting the semiconductor layer 21.

A portion of a gate insulating layer 12 is located between the semiconductor layer 21 and the gate electrode 22, and a portion of an interlayer insulating layer 13 is located between the gate electrode 22 and the electrodes 23 and 24. The capacitor 30 includes a first capacitance plate 31 formed on the gate insulating layer 12 and includes a second capacitance plate 32 formed on the interlayer insulating layer 13. The first capacitance plate 31 may be formed of the same material as that of the gate electrode 22, and the second capacitance plate 32 may be formed of the same material as that of the electrodes 23 and 24. The second capacitance plate 32 may be connected to the source electrode 23.

The thin film transistor 20 illustrated in FIG. 2A and FIG. 2B is a driving thin film transistor, and the pixel circuit further includes a switching thin film transistor (not shown). The switching thin film transistor is used as a switching device that selects a pixel to emit light, and the driving thin film transistor applies power for the selected pixel to emit light.

A planarization layer 14 (or insulating layer 14) is located on the electrodes 23 and 24 and the second capacitance plate 32. The planarization layer 14 may be formed of an organic material, an inorganic material, or a combination of an organic material and an inorganic material. The planarization layer 14 has a via (or hole) that exposes a part of the drain electrode 24. The pixel electrode 41 and a pixel defining layer 15 are formed on the planarization layer 14.

The pixel electrode 41 is insulated from the pixel electrodes 41 of other pixels and is connected to the drain electrode 24 of the thin film transistor 20 through the via (or hole). The pixel defining layer 15 is formed between the pixel electrodes 41 of different pixels to partition pixel areas and has openings that expose the pixel electrodes 41. The organic emission layer 42 is formed on (and contacts) the exposed pixel electrode 41.

The organic emission layer 42 may be formed when the thin film 60 is formed or may be formed after error correction using the alignment mark 50 and the thin film 60 for the test has been completed. After the organic emission layer 42 has been formed, the common electrode 43 is formed substantially completely throughout the first area A10 so as to form an organic light emitting diode 40 with the pixel electrode 41 and the organic emission layer 42 in each pixel PE.

The organic emission layer 42 may be one of a red emission layer, a green emission layer, and a blue emission layer. One of the pixel electrode 41 and the common electrode 43 is an anode (i.e., a hole injection electrode), and the other is a cathode (i.e., an electron injection electrode). A hole injected from the anode and an electron injected from the cathode are combined in the organic emission layer 42 to generate an exciton, and light is emitted while the exciton releases energy.

At least one of a hole injection layer and a hole transport layer may be located between the anode and the organic emission layer 42, and at least one of an electron injection layer and an electron transport layer may be located between the cathode and the organic emission layer 42. The hole injection layer, the hole transport layer, the electron transport layer, and electron injection layer may be formed substantially completely throughout the first area A10.

One of the pixel electrode 41 and the common electrode 43 may be a reflective layer, and the other may be a transflective film or a transparent conductive layer. Light emitted from the organic emission layer 42 is reflected in the reflective layer and is transmitted through the transflective film or the transparent conductive layer to the outside. The transflective film and the reflective layer may form a resonance structure for a part of the light emitted from the organic emission layer 42 to be re-reflected by the reflective layer.

Configurations of the thin film transistor 20 and the capacitor 30 illustrated in FIG. 2A and FIG. 2B are illustrative. The substrate 100 according to embodiments of the invention is not limited to the illustrated examples.

Figure 3:
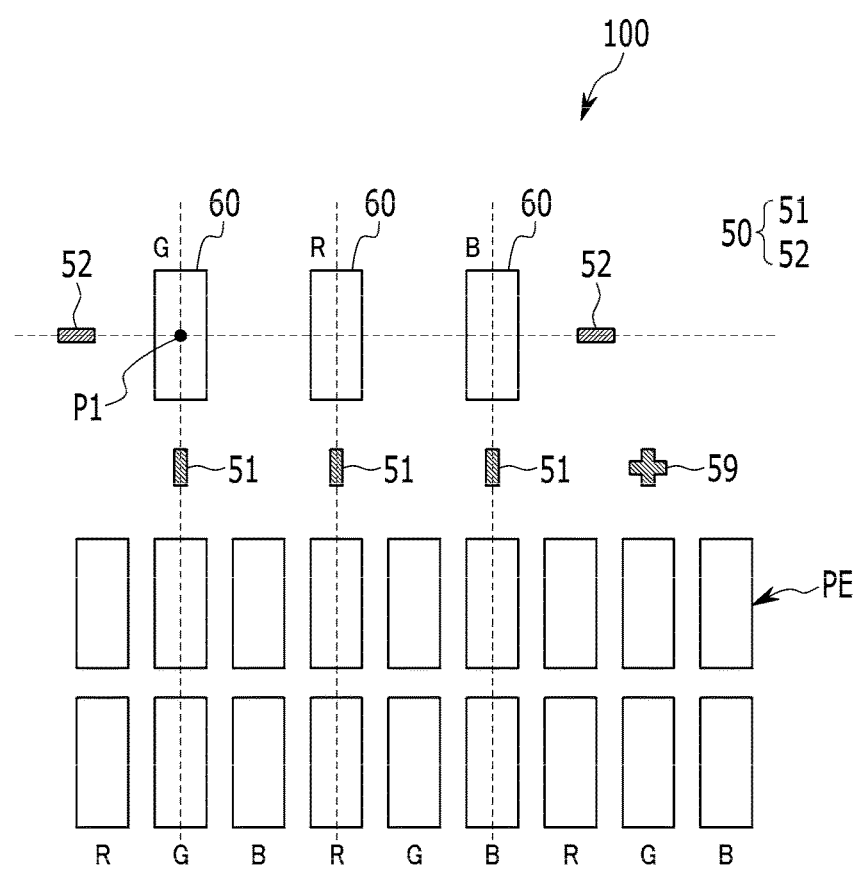
FIG. 3 is a plan view illustrating a portion of the substrate illustrated in FIG. 1 according to an embodiment of the present invention.
Figure 3:
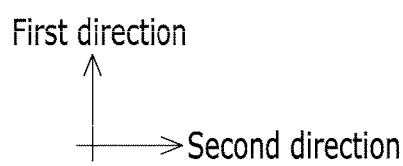

FIG. 3 is a plan view illustrating a portion of the substrate 100 illustrated in FIG. 1 according to an embodiment of the present invention.

Referring to FIGS. 1 and 3, the plurality of pixels PE may be aligned in a first direction on the substrate 100 and a second direction crossing the first direction. In an embodiment, the first direction and the second direction may be orthogonal to each other. In an embodiment, the plurality of pixels PE may be arranged in a zigzag pattern.

Each of the plurality of pixels PE and the plurality of organic emission layers 42 included in the pixels may be formed in one or more of various shapes, such as a rectangle having round corners, a track, a triangle, a rhombus, and so on. In FIG. 3, the plurality of pixels PE is schematically illustrated in a quadrangular shape.

In an embodiment, pixels PE having the same color may be arranged in one of the first direction and the second direction, and pixels PE having different colors may be alternately arranged in the other direction. In an embodiment, pixels PE having at least two colors may be alternately located in the first direction and the second direction. In an embodiment, as illustrated in FIG. 3, pixels PE having the same color are arranged in the first direction, and pixels PE having different colors are alternately located in the second direction.

The alignment mark 50 includes at least two marks for forming a reference point that is set at a virtual intersecting point where at least two lines corresponding to the marks intersect each other. In an embodiment, the alignment mark 50 includes a first mark 51 and a second mark 52. The first mark 51 has a bar shape having two long sides extending in the first direction. The second mark 52 has a bar shape having two long sides extending in the second direction. The second mark 52 may be separated from the first mark 51 in the first direction.

Accordingly, when images of the first mark 51 and the second mark 52 are captured (e.g., photographed) by a measurement equipment (not shown) that includes an imaging camera, a controller of the measurement equipment can recognize a center line corresponding to the first mark 51 (i.e., a virtual line that extends in the first direction across the first mark 51 and passes through the center of the first mark 51) and a center line corresponding to the second mark 52 (i.e., a virtual line that extends in the second direction across the second mark 52 and passes through the center of the second mark 52) through software processing. Further, the controller of the measurement equipment can recognize a point where the center line corresponding to the first mark 51 and the center line corresponding to the second mark 52 intersect as a reference point P1.

The center line corresponding to the first mark 51 is parallel to the two long sides of the first mark 51 and keeps the same distance from the two long sides. The center line corresponding to the second mark 52 is parallel to the two long sides of the second mark 52 and keeps the same distance from the two long sides.

The reference point P1 set by the first mark 51 and the second mark 52 is used to indicate a central location (or center) of an opening of a pattern mask (not shown) used for forming the thin film 60 for use in performing the test. In an embodiment, the opening for forming the thin film 60 is formed in the pattern mask, and the first mark 51 and the second mark 52 are formed on the base substrate 100 to indicate the central location of the opening.

The center line corresponding to the first mark 51 may match a center line corresponding to a column of the pixels PE in the first direction. In an embodiment, the reference point P1 (set by the first mark 51 and the second mark 52) is aligned with centers of pixels PE that are arranged in a column in the first direction.

The opening (hereinafter referred to as a first opening) of the pattern mask configured for forming the thin film 60 has substantially the same shape and size as those of an opening (hereinafter referred to as a second opening) configured for forming an organic emission layer. The thin film 60 may be formed of an organic material. In an embodiment, the first opening is not rotated with respect to the second opening; the first opening maintains the same orientation as that of the second opening and is aligned with the second opening. The first opening may appear to be a duplicate of the second opening that is shifted from the position of the second opening to a different position.

Figure 4:
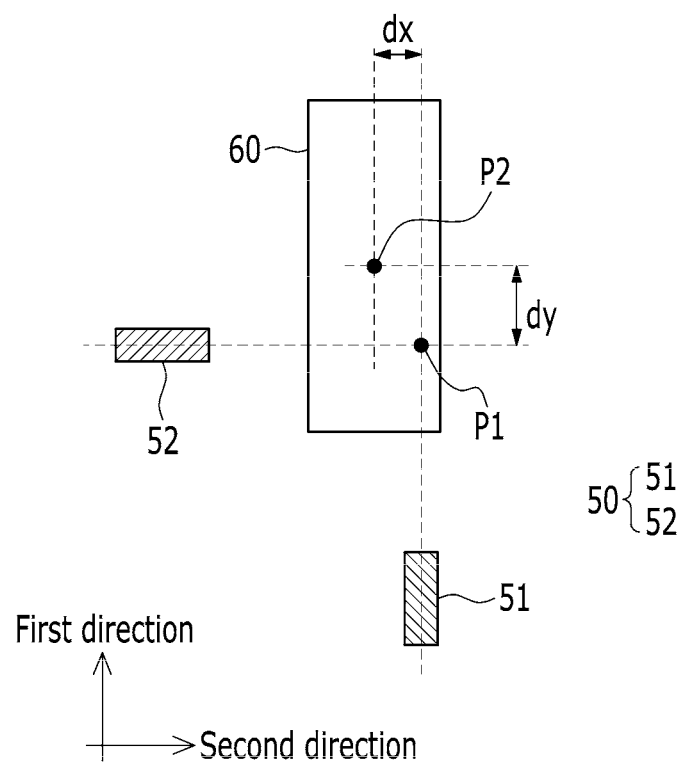
FIG. 4 is a plan view provided for discussing some elements illustrated in FIG. 3 according to an embodiment of the present invention.

FIG. 4 is a plan view provided for discussing some elements illustrated in FIG. 3 according to an embodiment of the present invention.

Referring to FIGS. 3 and 4, the center point of the thin film 60 may coincide with the reference point P1 or may be spaced from the reference point P1. In embodiments of the invention, the thin film 60 does not overlap the first mark 51 and does not overlap the second mark 52.

When images of the first mark 51, the second mark 52, and the thin film 60 are captured (e.g., photographed) by the measurement equipment after the thin film 60 has been formed, the controller of the measurement equipment recognizes a center point P2 of the thin film 60 and the reference point P1 associated with the alignment mark 50 through software processing and measures distances dx (in the second direction) and dy (in the first direction) between the center point P2 of the thin film 60 and the reference point P1. The separation distances between the center point P2 of the thin film 60 and the reference point P1 are substantially equal (or equivalent) to errors in the alignment between the substrate 100 and the pattern mask.

In an embodiment, the alignment mark 50 and the thin film 60 are used for identifying the error(s) in the alignment between the substrate 100 and the pattern mask during the deposition process for forming the organic emission layer 42. In an embodiment, the alignment mark 50 and the thin film 60 do not need to overlap each other. In an embodiment, the alignment mark 50 and the thin film 60 do not overlap each other.

If a thin film used for testing alignment overlaps an alignment mark, the measurement equipment can recognize the center point of the alignment mark and the center point of the thin film and can measure the error in the alignment between the substrate and the pattern mask through measuring distances between the two center points.

If a measurement range of the measurement equipment for measuring a location of the thin film were limited by the alignment mark and if the thin film were required to overlap the alignment mark, measurement might not be correctly performed when the location of the thin film is not within the predetermined measurement range of the measurement equipment or when the thin film does not overlap the alignment mark.

If the thin film overlaps the alignment mark, a measurement error may occur due to interference between an image of the alignment mark and an image of the thin film.

In an embodiment, the thin film 60 does not overlap the alignment mark 50. Therefore, measurement range of the measurement equipment for measuring the location of the thin film 60 may be maximized, and potential image interference may be prevented. Advantageously, substantially accurate measurements may be obtained.

At least one thin film 60 may be formed for each color of the pixels PE. In an embodiment, the plurality of pixels PE includes at least two pixels PE having different shapes, at least one thin film 60 may be formed for each of the different shapes. In an embodiment, at least one first mark 51 may be formed for each color and/or each shape of the pixels PE.

In an embodiment, the plurality of pixels PE has three colors, such as red R, green G, and blue B as illustrated in FIG. 3; accordingly, the alignment mark 50 may include at least three first marks 51 corresponding to the three colors. In an embodiment, since the center line(s) corresponding to second mark(s) 52 may cross the center lines corresponding to the plurality of first marks 51 to set a plurality of reference points P1, the number of second marks 52 may be smaller than the number of first marks 51. For example, the center line of corresponding to one second mark 52 may cross the three center lines corresponding to three first marks 51 to set three reference points P1.

Each of the at least three first marks 51 may be aligned with a center line of a column of pixels PE configured for displaying red R, a center line of a column of pixels PE configured for displaying green G, or a center line of a column of pixels PE configured for displaying blue B. Further, each of the thin film 60 for the test of red R, the thin film 60 for the test of green G, and the thin film 60 for the test of blue B may be formed on the reference points P1 set by the first mark 51 and the second mark 52.

Locations and numbers of alignment marks 50 and thin films 60 are not limited to the illustrated example and may be variously modified for different embodiments.

In an embodiment, a cross key 59 configured for calibrating an alignment between the substrate 100 and the measurement equipment may be formed in the second area A20.

Figure 5:
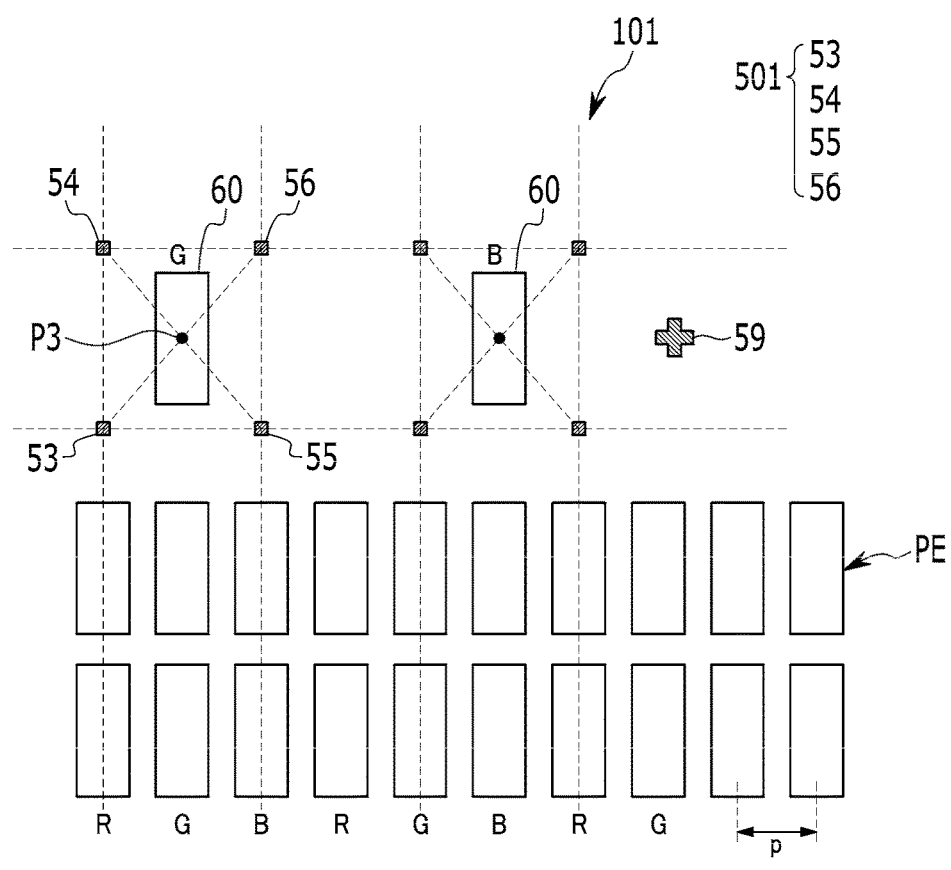
FIG. 5 is a plan view illustrating a portion of a substrate for use in a display device according to an embodiment of the present invention.

FIG. 5 is a plan view illustrating a portion of a substrate 101 for use in a display device according to an embodiment of the present invention.

Referring to FIG. 5, the substrate 101 may have components and features that are analogous to components and features of the aforementioned substrate 100. The same reference numerals may be used for indicating the same components shared by the substrate 101 and the substrate 101.

The substrate 101 may include an alignment mark 501. The alignment mark 501 includes a third mark 53 and a fourth mark 54 that are aligned in the first direction. The alignment mark 501 further includes a fifth mark 55 and a sixth mark 56 that are spaced apart from the third mark 53 and the fourth mark 54, respectively, by the same distance in the second direction. The fifth mark 55 and the sixth mark 56 are aligned in the first direction. The four marks 53, 54, 55, and 56 correspond to four corners of a virtual square or rectangle.

When images of the four marks 53, 54, 55, and 56 are captured (e.g., photographed) by the measurement equipment, the controller of the measurement equipment can recognize a virtual connection line between (the center of) the third mark 53 and (the center of) the sixth mark 56 and a virtual connection line between (the center of) the fourth mark 54 and (the center of) the fifth mark 55 through software processing. The controller of the measurement equipment can recognize a point where the two connection lines intersect as a reference point P3. The center point of the thin film 60 may coincide with the third reference point P3 or may be spaced from the reference point P3. In embodiments of the invention, the thin film 60 does not overlap any of the four marks 53, 54, 55, and 56.

The third mark 53 and the fourth mark 54 may be located on a center line corresponding to a first column of pixels PE in the first direction. The fifth mark 55 and the sixth mark 56 may be located on a center line corresponding to a second column of pixels PE in the first direction. The center of the fifth mark 55 and the center of the sixth mark 56 may be spaced apart from the center of the third mark 53 and the center of the fourth mark 54 by a distance that is substantially equal to twice a pitch p of the pixels PE in the second direction. In an embodiment, the reference point P3 set by the four marks 53, 54, 55, and 56 is located on a center line corresponding to a third column of pixels PE in the first direction, wherein the third column of pixels PE may be located between the first column of pixels PE and the second column of pixels PE.

The distance between the center the fifth mark 55 and the center of the third mark 53 (or the distance between the center of the sixth mark 56 and the center of the fourth mark 54) may be set to be substantially equal to even multiples larger than double, such as quadruple or sextuple, of the pitch p of the pixels PE in the second direction. Since the lengths of the two connection lines become longer, for performing accurate measurement, a measurement range of the measurement equipment for measuring the alignment mark 501 and/or the thin film 60 should be expanded. In an embodiment, the inter-mark distance in the second direction is substantially equal to double of the pitch p of the pixels PE.

Figure 6:
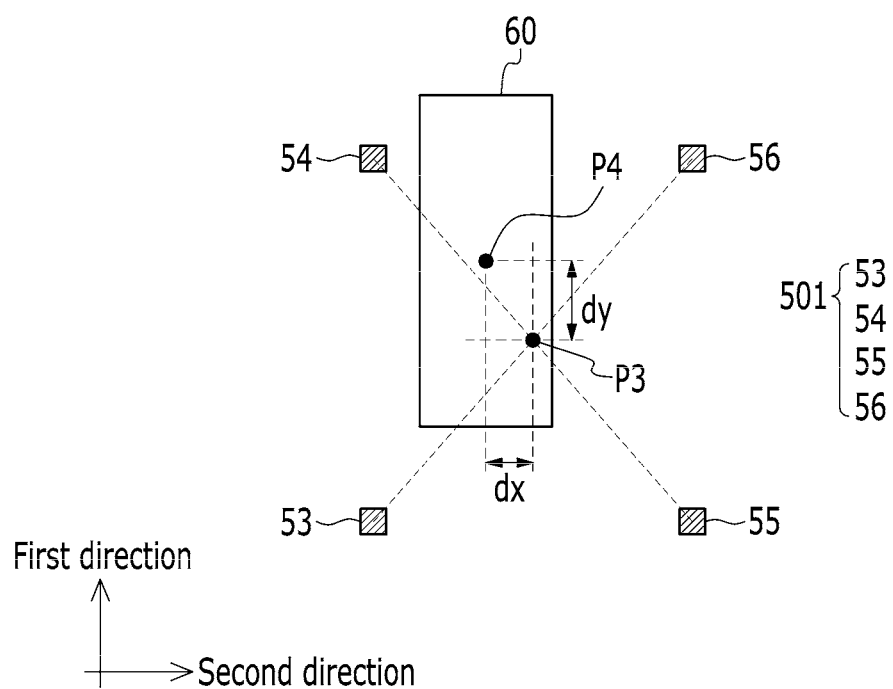
FIG. 6 is a plan view provided for discussing some elements illustrated in FIG. 5 according to an embodiment of the present invention.

FIG. 6 is a plan provided for discussing view of FIG. 5 according to an embodiment of the present invention.

Referring to FIGS. 5 and 6, when images of the alignment mark 501 and the thin film 60 are captured (e.g., photographed) by the measurement equipment after the thin film 60 is formed, the controller of the measurement equipment recognizes a center point P4 of the thin film 60 and the reference point P3 associated with the alignment mark 501 through software processing and measures distances dx and dy between the center point P4 of the thin film 60 and the reference point P3. The separation distances dx and dy between the center point P4 of the thin film 60 and the reference point P3 are substantially equal (or equivalent) to errors in the alignment between the substrate 101 and the pattern mask.

At least one thin film 60 may be formed for each color and/or each shape of the pixels PE. At least one alignment mark 501 (which includes four marks 53, 54, 55, and 56) may be formed for each color and/or each shape of the pixels PE. FIG. 5 illustrates two thin films 60 used for calibrating pixels of two colors G and B and illustrates two alignment marks 501 surrounding the two thin films 60, respectively, as an example.

Figure 7:
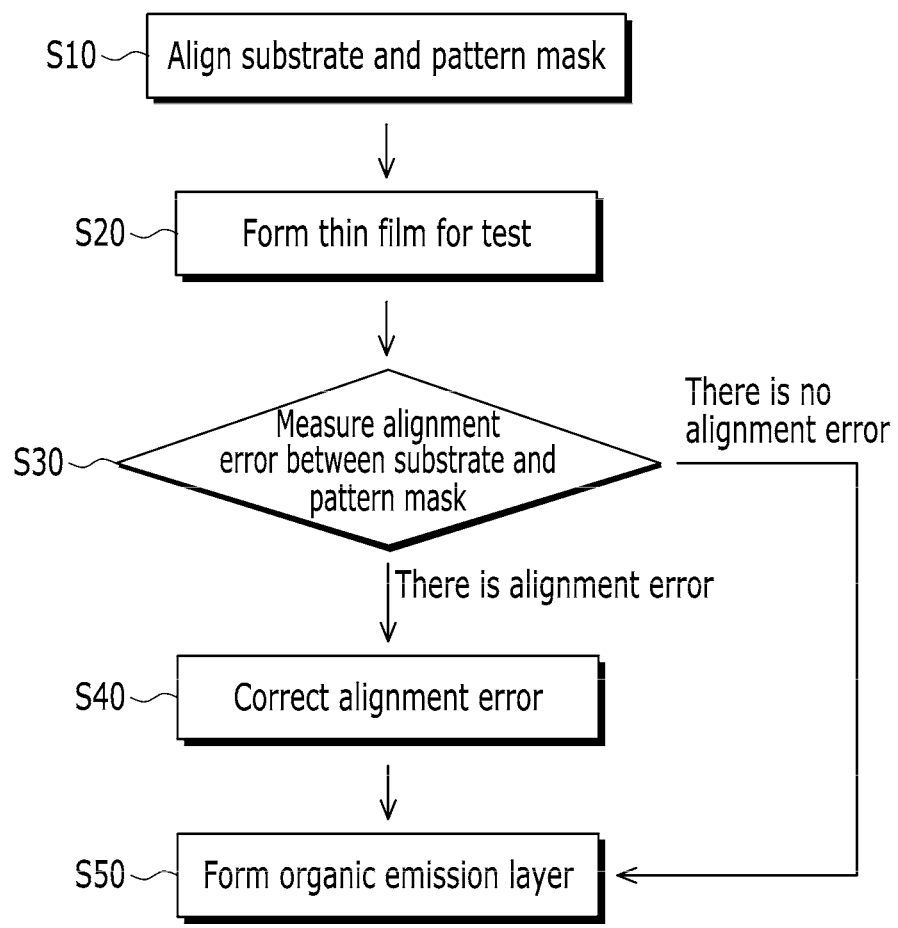
FIG. 7 is a flowchart illustrating a method for forming at least one element on at least one substrate according to an embodiment of the present invention.

FIG. 7 is a flowchart illustrating a method for forming at least one element on at least one substrate according to an embodiment of the present invention.

Referring to FIG. 7, in a first step S10, a mechanism (e.g., a robot arm) may dispose a substrate (which has at least an alignment mark 50 or 501) and a pattern mask into a deposition chamber. In a second step S20, a thin film (or indicator) may be formed (e.g., deposited) on the substrate using an opening of the pattern mask. In a third step S30, a measurement equipment may determine whether there is an error in alignment between the substrate and the pattern mask using an image of the alignment mark and an image of the thin film.

If there is an alignment error, in a fourth step S40, the alignment error is corrected. In a fifth step S50, an organic emission layer is formed in the substrate. The fourth step S40 is performed if an alignment error is identified in the third step S30; the fourth step S40 is omitted if no alignment error is identified in the third step S30.

Figure 8:
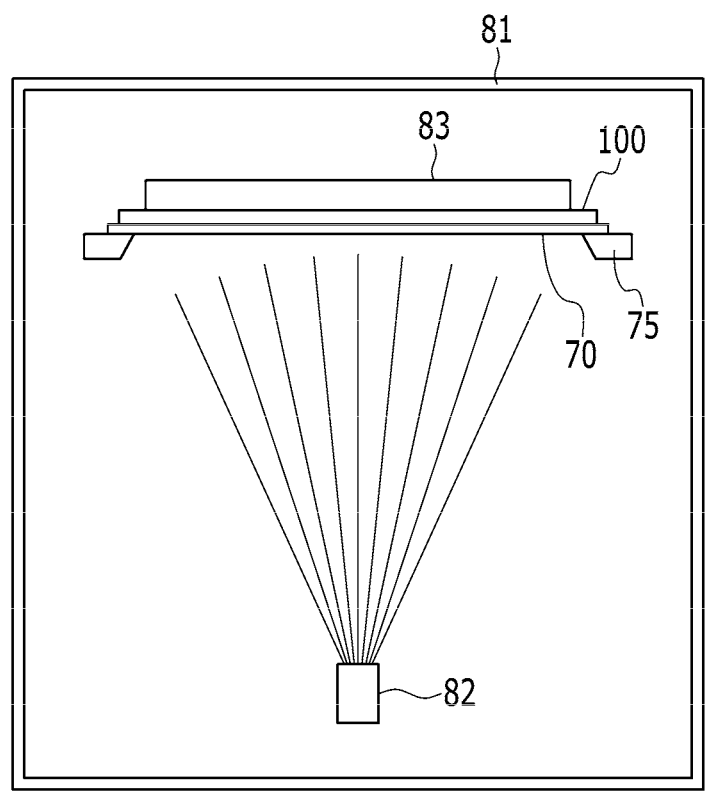
FIG. 8 is a view schematically illustrating steps illustrated in FIG. 7 according to an embodiment of the present invention.
Figure 9:
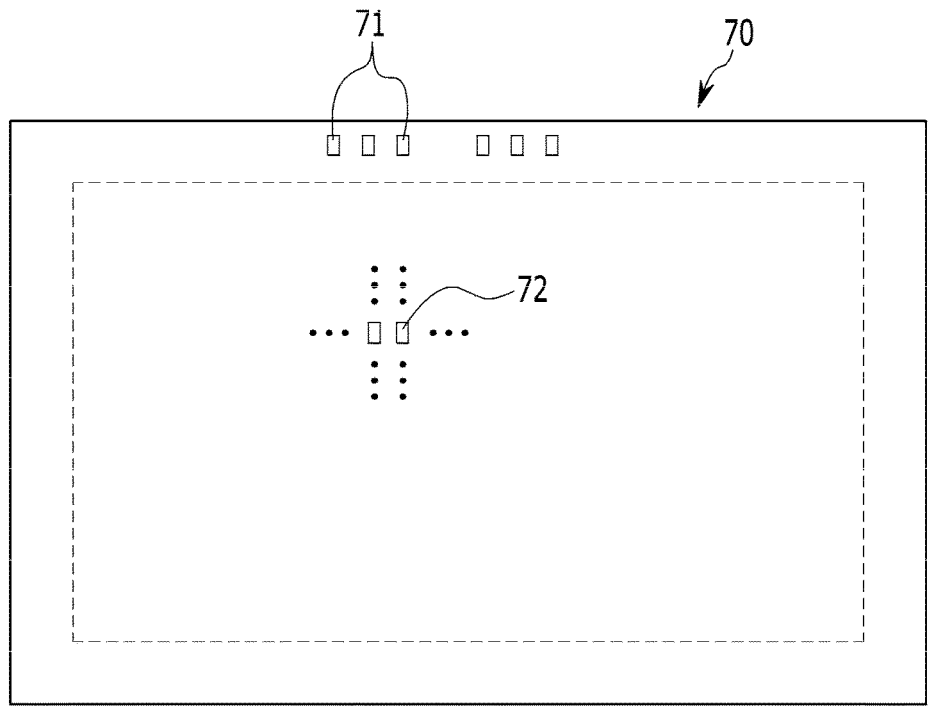
FIG. 9 is a plan view illustrating a pattern mask according to an embodiment of the present invention.

FIG. 8 is a view schematically illustrating steps illustrated in FIG. 7 according to an embodiment of the present invention. FIG. 9 is a plan view illustrating a pattern mask according to an embodiment of the present invention.

Referring to FIGS. 7, 8, and 9, in the first step S10, the substrate 100 and a pattern mask 70 are put into a deposition chamber 81 and are then arranged. An alignment mark 50 illustrated in FIG. 3 or an alignment mark 501 illustrated in FIG. 5 may exist in the second area A20 of the substrate 100. In the pattern mask, a first opening 71 for forming the thin film 60 may exist in an area that corresponds to the second area A20 of the substrate 100, and a second opening 72 for forming the organic emission layer 42 may exist in an area that corresponds to the first area A10.

A deposition source 82 is located inside the deposition chamber 81, and the pattern mask 70 is located between the deposition source 82 and the substrate 100. The pattern mask 70 may be fixed to a frame 75 and may be subjected to a tensile force. The substrate 100 may be disposed between the pattern mask 70 and a magnet unit 83, such that the pattern mask 70 (which is formed of a metal material) may be attracted by the magnet unit 83 to contact the substrate 100.

In the second step S20, an organic material is evaporated through heating the deposition source 82, such that a first evaporated organic material may be generated. A first portion of the first evaporated organic material may pass through the first opening 71 of the pattern mask 70 and may be deposited in the second area A20 on the substrate 100 to form the thin film 60. Substantially simultaneously, a second portion of the first evaporated organic material may pass through the second opening 72 and may be deposited in the first area A10 on the substrate 100 to form an organic emission layer 42. That is, the organic emission layer 42 and the thin film 60 may be substantially simultaneously formed.

In the third step S30 or in a step between the steps S20 and S30, the substrate 100 having the thin film 60 formed thereon is withdrawn from the deposition chamber 81 and moved to the measurement equipment. Subsequently, a succeeding substrate may be input into the deposition chamber 81 and may be in a standby state. When the substrate 100 is mounted to the measurement equipment, the substrate 100 may be accurately arranged in the measurement equipment using the cross key 59, which is formed in the second area A20. The cross key 59 may be used as a reference of a measurement location.

Figure 10:
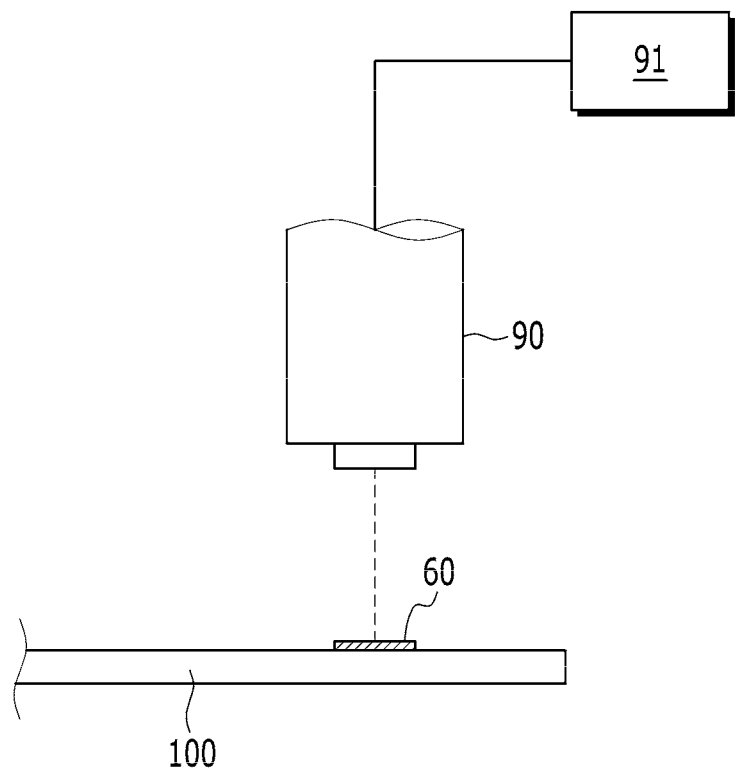
FIG. 10 is a view schematically illustrating a substrate and a measurement equipment used in a step illustrated in FIG. 7 according to an embodiment of the present invention.

FIG. 10 is a view schematically illustrating the substrate and the measurement equipment in the third step S30 illustrated in FIG. 7 according to an embodiment of the present invention.

Referring to FIG. 10, in the third step 30, an error in the alignment between the substrate 100 and the pattern mask 70 may be measured using the measurement equipment 90, which may include an image camera for capturing (e.g., photographing) images of the alignment mark 50 and the thin film 60.

Referring to FIGS. 4 and 10, the alignment mark 50 includes the first mark 51 and the second mark 52, each having a bar shape, and a controller 91 of the measurement equipment 90 may recognize the point where the center line corresponding to the first mark 51 and the center line corresponding to the second mark 52 intersect as the reference point P1. The controller 91 of the measurement equipment 90 may determine the center point P2 of the image of the thin film 60 and may determine (e.g., measure) the error in the alignment between the substrate 10 and the pattern mask 70 by measuring distances between the center point P2 of the thin film 60 and the reference point P1.

Referring to FIGS. 6 and 10, the alignment mark 501 includes the marks 53, 54, 55, and 56, and the controller 91 of the measurement equipment 90 may recognize the point where the connection line between the third mark 53 and the sixth mark 56 and the connection line between the fourth mark 54 and the fifth mark 55 intersect as the reference point P3. The controller 91 of the measurement equipment 90 may determine the center P4 of the image of the thin film 60 and may determine (e.g., measure) the error in the alignment between the substrate 101 and the pattern mask 70 by measuring distances between the center point P4 of the thin film 60 and the reference point P3.

Referring to FIG. 8, if a substrate-mask alignment error is identified in the third step S30, the alignment error is corrected by moving the pattern mask 70 or the succeeding substrate inside the deposition chamber 81 in the fourth step S40.

In the fifth step S50, an organic material is evaporated through heating the deposition source 82 to generate a second evaporated organic material. A first portion of the second evaporated organic material may pass through the second opening 72 of the pattern mask 70 and may be deposited on a succeeding substrate so as to form an organic emission layer 42. The substrate that has an alignment error identified in the third step S30 may be determined as a faulty substrate and may be discarded.

If no error in the alignment between the substrate 100 and the pattern mask 70 is identified in the third step S30, the fourth step S40 is omitted, and the organic emission layer 42 is formed on the succeeding substrate through heating the deposition source 82 in the fifth step S50. The substrate 100 with no identified alignment error in the third step S30 may be determined as a substrate with acceptable quality and may be transported to a subsequent process (e.g., a process for forming one or more of the hole injection layer, the hole transport layer, the electron transport layer, the electron injection layer, and the common electrode).

In an embodiment, in the second step S20, the thin film 60 and the organic emission layer 42 may not be simultaneously formed, but only the thin film 60 may be formed. If an alignment error is identified in the third step S30, the alignment error is corrected by moving the substrate 100 or the pattern mask 70 in the fourth step S40, and the organic emission layer 42 is formed in the fifth step S50. If no alignment error is measured in the third step S30, the fourth step S40 is omitted, and the organic emission layer 42 is formed in the fifth step S50.

While this disclosure has been described in connection with what is presently considered to be practical embodiments, it is to be understood that the invention is not limited to the disclosed embodiments. The invention is intended to cover various modifications and equivalent arrangements included within the spirit and scope of the appended claims.

| <Description of symbols> | |
| --- | --- |
| 100, 101: Substrate for a display device | 10: Base substrate |
| 20: Thin film transistor | 30: Capacitor |
| 40: Organic light emitting diode | 50, 501: Alignment mark |
| 60: Thin film for a test | 70: Pattern mask |
| 81: Deposition chamber | 82: Deposition source |

What is claimed is:

1. A method for forming at least one element on at least one substrate, the method comprising:
   disposing a first substrate and a mask in a chamber, wherein the first substrate includes a first area corresponding to a plurality of pixel positions, a second area adjacent to the first area, a first mark disposed in the second area, and a second mark disposed in the second area and spaced from the first mark, wherein a first virtual line corresponds to the first mark, wherein a second virtual line corresponds to the second mark and intersects the first virtual line at a first virtual reference point, and wherein the mask has a first opening and a second opening; and
   using the mask to form a first indicator in the second area, wherein the first indicator is spaced from each of the first mark and the second mark and corresponds to the first opening.

2. The method of claim 1, further comprising:
   using positional relation between the first virtual reference point and a point of the first indicator to assess a positional relation between the first substrate and the mask;
   determining that a distance between the first virtual reference point and the point of the first indicator has a first value;
   determining that the first value is unacceptable;
   adjusting at least one of a position of the mask and a position of the first substrate such that the distance between the first virtual reference point and the point of the first indicator has a second value that is acceptable; and
   after the adjusting, using the mask to form a deposited element in a first pixel position of the plurality of pixel positions, wherein the deposited element corresponds to the second opening.

3. The method of claim 1, further comprising:
   using positional relation between the first virtual reference point and a point of the first indicator to assess a positional relation between the first substrate and the mask;
   determining that a distance between the first virtual reference point and the point of the first indicator has a first value;
   determining that the first value is unacceptable;
   adjusting at least one of a position of the mask and a position of the first substrate such that the first substrate is at an acceptable position and such that the distance between the first virtual reference point and the point of the first indicator has a second value that is acceptable;
   after the adjusting, disposing a second substrate at the acceptable position; and
   using the mask to form a first deposited element on the second substrate, wherein the first element layer corresponds to the second opening.

4. The method of claim 3, further comprising:
   when forming the first indicator, using the mask to form a second deposited element in a first pixel position of the plurality of pixel positions, wherein the second deposited element corresponds to the second opening; and
   after the adjusting and before disposing the second substrate in the chamber, removing the first substrate from the chamber.

5. The method of claim 1, further comprising:
   using positional relation between the first virtual reference point and a point of the first indicator to assess a positional relation between the first substrate and the mask;
   determining that a distance between the first virtual reference point and the point of the first indicator is acceptable; and
   after the determining, using the mask to form a deposited element in a first pixel position of the plurality of pixel positions, wherein the deposited element corresponds to the second opening.

6. The method of claim 1, further comprising:
   using positional relation between the first virtual reference point and a point of the first indicator to assess a positional relation between the first substrate and the mask;
   when forming the first indicator, using the mask to form a deposited element in a first pixel position of the plurality of pixel positions, wherein the deposited element corresponds to the second opening; and
   determining whether a distance between the first virtual reference point and the point of the first indicator is acceptable.

7. The method of claim 1,
   wherein a first side of the first mark is longer than a second side of the first mark and extends in a first direction,
   wherein a first side of the second mark is longer than a second side of the second mark and extends in a second direction different from the first direction.

8. The method of claim 1,
   wherein the first substrate further includes a third mark and a fourth mark,
   wherein the third mark is disposed in the second area and is spaced from each of the first mark and the second mark,
   wherein the fourth mark is disposed in the second area and is spaced from each of the first mark, the second mark, and the third mark,
   wherein the first virtual line further corresponds to the fourth mark,
   wherein the second virtual line further corresponds to the third mark,
   wherein the first indicator is formed between the first mark and the fourth mark, and
   wherein the first indicator is formed between the second mark and the third mark.

9. The method of claim 8,
   wherein the first mark is aligned with the second mark in a first direction, wherein the first mark is aligned with the third mark in a second direction different from the first direction, and wherein the third mark is aligned with the fourth mark in the second direction.

10. The method of claim 8, wherein a distance between a center the first mark and a center of the third mark is equal to a multiple of a double of a distance between a center of a first pixel position of the plurality of pixel positions and a center of a second pixel position of the plurality of pixel positions, the second pixel position immediately neighboring the first pixel position.

* * * * *